(12) United States Patent
Zipper et al.

(10) Patent No.: US 7,738,594 B2
(45) Date of Patent: Jun. 15, 2010

(54) METHOD TO MAINTAIN RF POWER AMPLIFIER LINEARITY IN VARYING LOAD VSWR CONDITIONS WITHOUT ISOLATOR

(75) Inventors: Eliav Zipper, Tel-Aviv (IL); Alex Zaslavsky, Petach Tikva (IL)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 11/479,900

(22) Filed: Jun. 30, 2006

(65) Prior Publication Data

US 2008/0002787 A1    Jan. 3, 2008

(51) Int. Cl.
H04K 1/02        (2006.01)
(52) U.S. Cl. .................................................. 375/297
(58) Field of Classification Search ............... 375/296, 375/297; 330/127, 149, 279
See application file for complete search history.

(56) References Cited

U.S. PATENT DOCUMENTS

| 5,150,075 A | 9/1992 | Hietala et al. |
| 6,166,598 A * | 12/2000 | Schlueter .................... 330/127 |
| 7,085,330 B1 * | 8/2006 | Shirali ........................ 375/296 |
| 7,215,933 B1 * | 5/2007 | Tse et al. ................. 455/127.2 |
| 2003/0179829 A1 * | 9/2003 | Pinckley et al. ............ 375/295 |
| 2006/0246858 A1 * | 11/2006 | Boerman et al. ......... 455/127.1 |

* cited by examiner

*Primary Examiner*—Don N Vo
(74) *Attorney, Agent, or Firm*—Blakely, Sokoloff, Taylor & Zafman LLP

(57) ABSTRACT

The peak-to-average power ratio at the output of an rf power amplifier is detected and compared with, for instance, an ideal ratio. The result of this comparison is used to control the amplifier, particularly to reduce distortion in the output signal.

9 Claims, 3 Drawing Sheets

UNDISTORTED WAVEFORM

DISTORTED WAVEFORM

METHOD TO MAINTAIN RF POWER AMPLIFIER LINEARITY IN VARYING LOAD VSWR CONDITIONS WITHOUT ISOLATOR

FIELD OF THE INVENTION

The invention relates to the field of power amplifiers for radio frequency applications.

PRIOR ART AND RELATED ART

In wireless and cellular applications, a transceiver typically includes a power amplifier for amplifying a transmitted signal. The amplifier is coupled to an antenna having generally unstable impedance causing reflected signal through other elements such as filters, switches and a transmission line. These reflections can cause the amplifier to exceed its allowed non-linearity. In some applications such as CDMA, WCDMA or other, where the linearity is critical, an isolator is used between the power amplifier and antenna in order to reduce the reflections significantly, although using isolators is undesirable where size and cost need to be reduced, particularly for multi-band applications where more than a single isolator may be required Several solutions have been considered for isolator-free transceivers. These include the use of hybrid couplers to combine the pair of power amplifier into one power amplifier (known as "balanced PA") less sensitive to load mismatch and reflections. Another approach requires the sensing of the voltage standing wave ratio (VSWR). In yet other cases, a collector peak detector is used within the power amplifier to detect non-linear operation. In still other cases, an adaptive pre-distortion feedback technique is used.

One approach to the power amplifier control is described in U.S. Pat. No. 5,150,075. Here, a power level signal at the output of the amplifier is compared to a DC offset established when no transmission is occurring. In addition, a saturation control loop is used to prevent amplification above a predetermined level.

BRIEF DESCRIPTION OF THE DRAWINGS

FIGS. 1A and 1B are used to describe the significance of the peak-to-average ratio.

DETAILED DESCRIPTION

A method of controlling a power amplifier, particularly an amplifier which is part of a wireless or cellular transceiver is described. In the following description, numerous specific details are set forth to provide a thorough understanding of the present invention. It will be apparent to one skilled in the art, that the present invention may be practiced without these details. In other instances, well-known circuits and processing techniques, such as those associated with a digital signal processor (DSP) are not described in detail, in order to avoid unnecessarily obscuring the present invention.

As will be seen below, the ratio of the peak power to average power or the ratio of the peak voltage to the average voltage associated with the signal at the output of a power amplifier is used to control the output of the amplifier. In effect, the ratio is used to implement a relatively simplified, low-cost, adaptive control loop. In the description below, the ratio of the peak-to-average power and the peak-to-average voltage are used interchangeably.

Figure 1A:
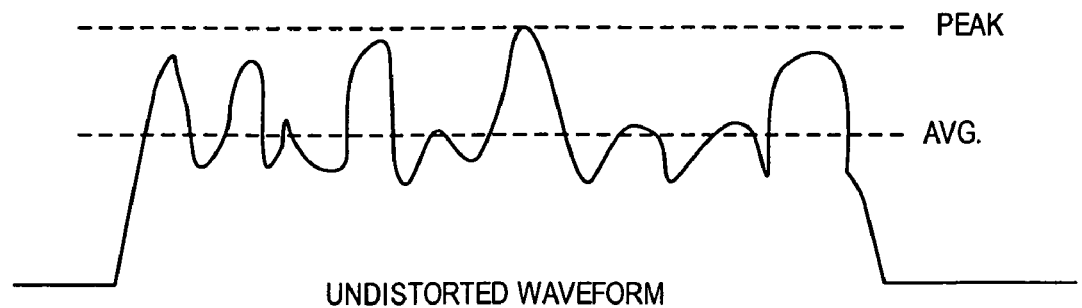
FIG. 1A illustrates an envelope of a waveform at the output of a power amplifier without distortion.
Figure 1B:
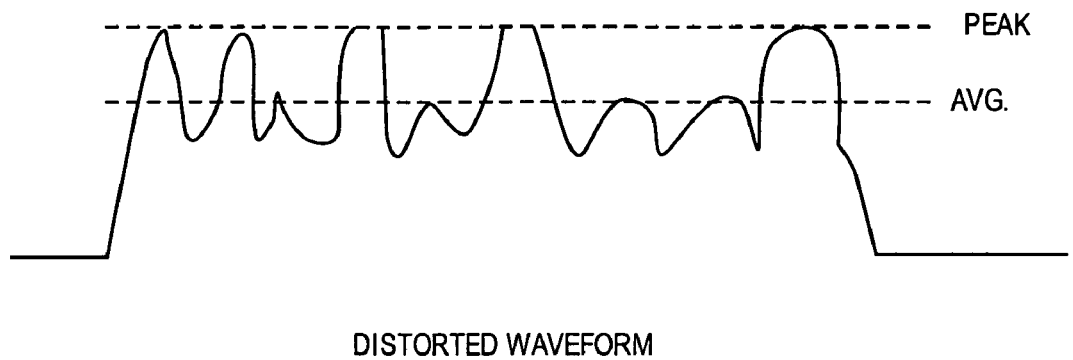
FIG. 1B illustrates the waveform of FIG. 1A with distortion. Both

Referring first to FIG. 1A, the envelope of a waveform at the output of a radio frequency (rf) power amplifier is illustrated. (The carrier associated with this waveform and the waveform of FIG. 1B are not illustrated.) The average power is represented by the dashed line labeled "AVG," and the peak power is also shown. For purposes of discussion, it is assumed that the waveform of FIG. 1A is distorted. The same waveform is illustrated in FIG. 1B with the distortion. As can be seen in FIG. 1B, the peak and average values are illustrated, and the ratio of peak-to-average power is reduced when compared with the ratio for FIG. 1A. As described below, upon detection of a reduced peak-to-average ratio at the output of the amplifier, in one embodiment, the transmitted signal power is scaled down by an algorithm in a DSP or other control logic. This restores the ratio to a predetermined or other more ideal level. A reduction in the transmitted signal is typically permitted by cellular/wireless service providers when a non-ideal VSWR is present due to antenna mismatch.

Figure 2:
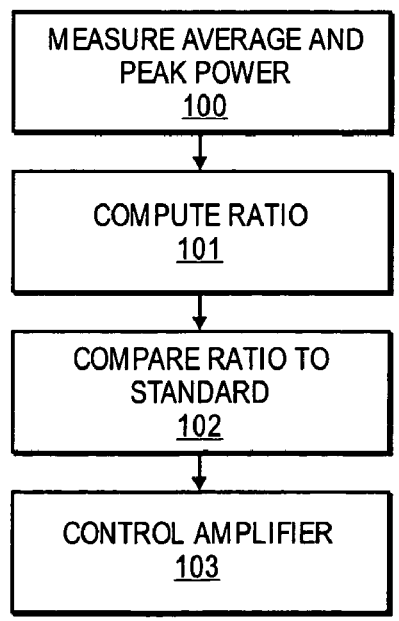
FIG. 2 is a flow diagram illustrating steps used in the method of the present invention.

The method described above is illustrated in conjunction with FIG. 2. At step 100 the average power and peak power at the output of the power amplifier is measured. From these two values, the ratio is computed as shown by step 101. In one embodiment, the peak and average power are sensed separately as analog signals, and then, these signals are converted to digital signals. The computation of the ratio of step 101 is performed as an ordinary division.

Next, as illustrated in step 102, the ratio from step 101 is compared to a desired ratio. As will be described below in some cases the desired ratio is derived from the DSP. In other cases, it is measured at the input to the power amplifier. In still another embodiment, a predetermined ideal value or a value measured at a lower power level is used. The results of the comparison are used to control the power amplifier, as shown by step 103. For instance, when the sensed ratio at the output of the power amplifier decreases, an algorithm in the DSP is used to lower the input drive to the amplifier. Other methods for reducing the distortion are described below.

Figure 3:
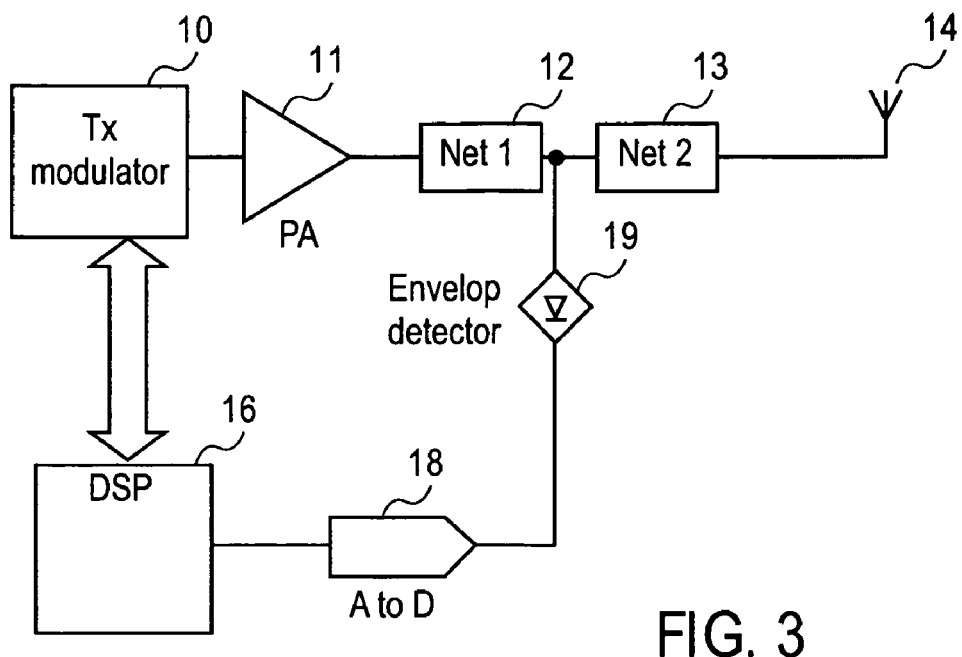
FIG. 3 is a block diagram of a first embodiment where a single detector and DSP are used.

Referring now to FIG. 3, the rf power amplifier 11 receives an input signal from a transmit modulator 10. The transmit signal is delivered to the modulator from the DSP 16. The output of the power amplifier 11 is coupled to an antenna 14. In FIG. 3, this output is shown coupled through two networks 12 and 13. These networks may be, for example, ordinary lumped inductors, capacitors or resistors associated with filters, switches or other circuit elements. These networks may represent the distributed impedance associated with a transmission line which couples the amplifier to the antenna.

An envelope detector 19 senses the envelope of the rf signal in the line connecting the amplifier 11 with the antenna 14. This detection, in its simplest form, may be done with a diode. The sensed (envelope) signal is coupled to an analog-to-digital (A to D) converter 18 where the analog signal from the detector 19 is sampled and digitized. The output of the A to D converter 18 is coupled to the DSP 16.

The DSP 16 averages the samples to provide an average voltage or power. Similarly, the DSP 16 determines the peak value associated with the samples over a period of time sufficiently long to detect a statistical peak value. The DSP 16 computes the ratio of the peak-to-average power. As will be seen below for the embodiments of FIGS. 5 and 6, the input ratio is measured and compared with the output ratio. Moreover, the DSP could maintain a histogram of amplitude and from there determine the peak and average.

The measured peak-to-average ratio is compared to an ideal or acceptable peak-to-average value representing non-distorted signal. For instance, for a particular power amplifier and network 12 and 13, an ideal predetermined (fixed) value for the peak-to-average ratio may be used. This ratio may be a function of signal modulation parameters. It will be apparent to one skilled in the art that different algorithms may be used for determining an acceptable or ideal peak-to-power ratio that may be compared with the measured ratio from the A to D converter 18.

Figure 4:
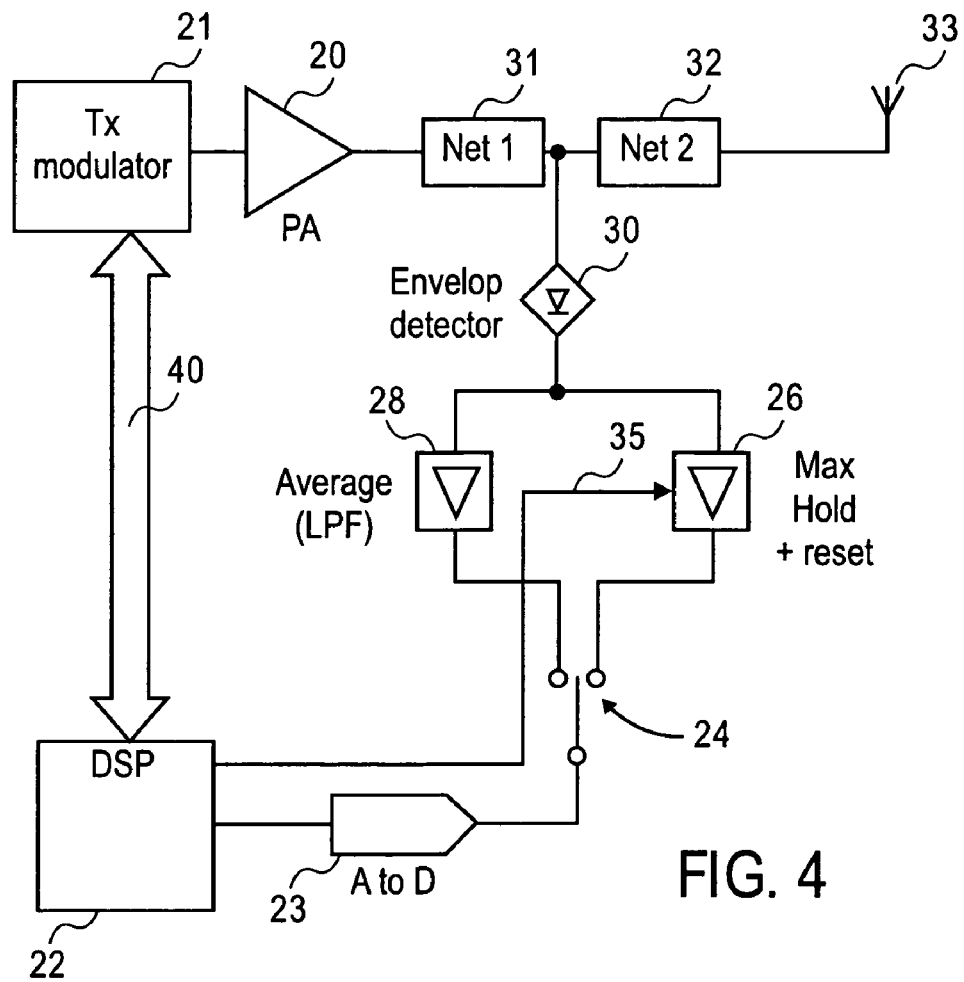
FIG. 4 is an alternate embodiment where separate circuits are used for detecting average and peak values.

In FIG. 4, a DSP 22, modulator 21, power amplifier 20, networks 31 and 32, and antenna 33 are shown. These may be the same or substantially the same as the components described above for FIG. 3. Again, the envelope between the networks 31 and 32 is detected by an envelope detector 30, which may be similar to the detector 19 of FIG. 3.

Unlike the embodiment of FIG. 3, a hardware averaging circuit 28 for detecting the average envelope is used. Here, the A to D converter may have a lower sampling rate. As an example, a low pass filter (LPF) is used. A circuit 26 which may be any one of numerous well-known circuits for holding a maximum value and resetting is used. Circuit 26 is reset periodically to allow a new peak value to be sensed. A line 35 from DSP 22 provides the reset signal. Thus, at a switch 24, both the average and maximum value of the rf envelope are present. The switch 24 alternately couples these values to the A to D converter 23 where they are sampled and converted to a digital signal. The switch 24 may be part of the connector 23 and provide the sampling function. The digital signals from the connector are coupled to the DSP 22 where the peak-to-average ratio is determined. This ratio, with processing in DSP 22 is compared to the ideal ratio. A control signal through the bus 40, controls the input signal to the amplifier 20.

Figure 5:
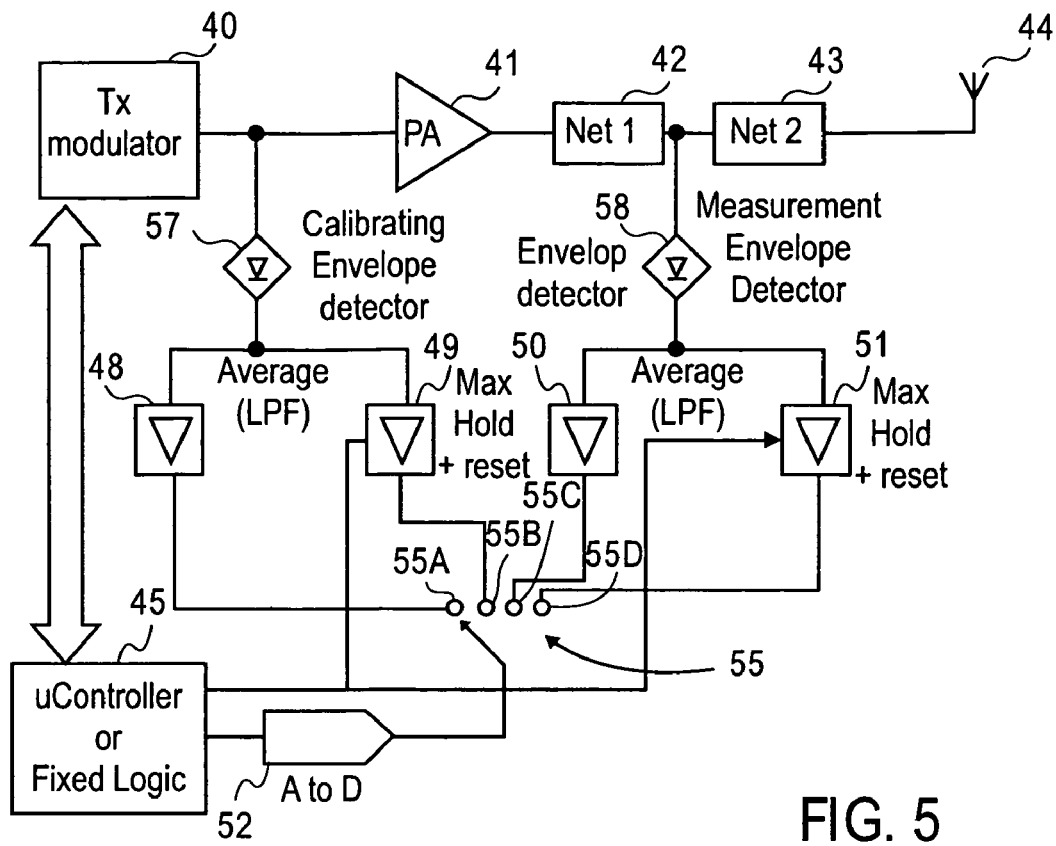
FIG. 5 is a block diagram of yet another embodiment having both an input (calibration) detector and an output (measurement) detector, and where a microcontroller is used.

In the embodiment of FIG. 5, a transmit modulator 40, power amplifier 41, networks 42 and 43, and antenna 44 are illustrated. These elements may be similar to the components described in conjunction with the other embodiments. For this embodiment, an envelope detector 57 provides an envelope of the input signal to the amplifier 91. The output envelope detector 48 provides an envelope of the output signal from the amplifier 41. An averaging circuit 48 and maximum hold and reset circuit 49 coupled to the detector 57 provide the average value and maximum value of the input signal at the poles 55A and 55B of the switch 55. Similarly, the detector 58 senses the output envelope and couples it to the averaging circuit 50 and the maximum hold and reset circuit 51. The output of these circuits are connected to the poles 55C and 55D, respectively, of the switch 55.

The switch 55 alternately couples each of the poles 55A-55D to the A to D converter 52 where the analog values on the poles are converted to digital signals. Here, once again the A to D converter may be a slower circuit and consequently the switching occurs at a relatively slow rate. The digital signals are coupled to a microcontroller or other fixed logic 45. Again, a reset signal is coupled to both the circuits 49 and 51 to periodically reset the maximum held value. Also, the switch 55 may be an integral part of the A to D converter 52.

For the embodiment of FIG. 5, a microcontroller or other logic is used to compute both the input and output peak-to-average ratios. The controller 45 also periodically provides the reset signal. The controller 45 may implement an algorithm which compares the two ratios and then provides a control signal to the modulator 40. While not illustrated, in this embodiment or other embodiments, a control signal may be coupled directly to the power amplifier for controlling the output signal from the amplifier. For example, by varying the DC potential used by the amplifier, the output signal can be controlled in some amplifiers. Alternatively, a VGA at the input to the power amplifier can be controlled. For the embodiment of FIG. 5, an input signal to the power amplifier is connected to the modulator 40 and then to the power amplifier 41. The input signal does not necessarily need to be connected to the controller 45.

Figure 6:
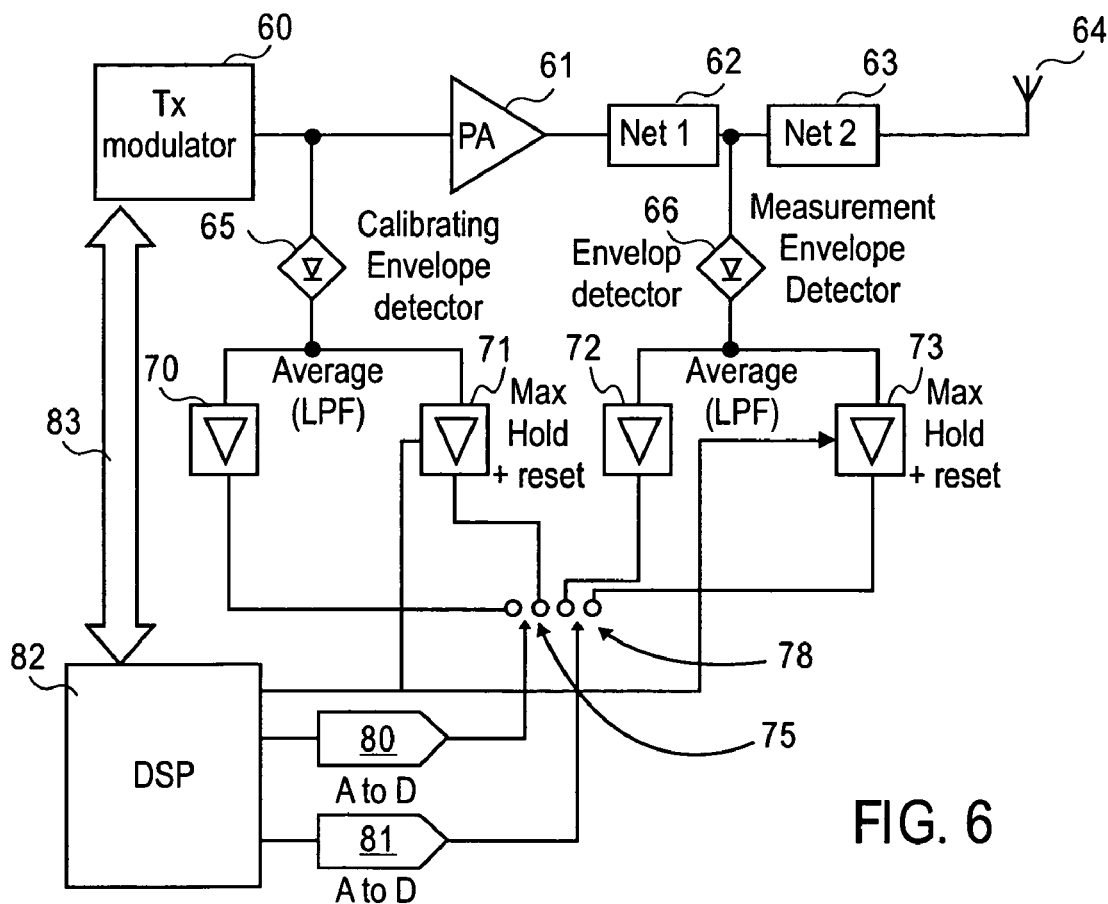
FIG. 6 is a block diagram of still another embodiment using two detectors and two analog-to-digital (A to D) converters.

In the embodiment of FIG. 6, a DSP 82, modulator 60, power amplifier 61, networks 62 and 63, and an antenna 64, which may be similar to the embodiment of FIG. 4, are illustrated. This embodiment is similar to the embodiment of FIG. 5 in that it provides a measured ratio at both the input and to its output of the amplifier. The envelope detector 65 of FIG. 6 is coupled to the input of the amplifier 61 and provides the signal representing the envelope to the averaging circuit 70 and the maximum hold and reset circuit 71. Similarly, the detector 66 at the output of the amplifier 66, is coupled to an averaging circuit 72 and the maximum hold and reset circuit 73. The signals from the circuit 70 and 71 are coupled to a switch 75, and similarly, the signals from the circuits 72 and 73 are coupled to a switch 78.

In the embodiment of FIG. 6, two A to D converters 80 and 81 are used. One receives the signals from the switch 75, and the other receives signals from the switch 78. As was the case in the earlier embodiments, the switches provide analog signals to their respective poles, which are sampled and converted into digital signals. The advantage to the embodiment of FIG. 6 is that faster conversion can occur since there are two A to D converters. In this way, the DSP 82 can compute the two ratios more quickly and therefore provide the comparison and the control of the modulator 60 through the DSP 82 more rapidly. Typically, it is the A to D are the critical component in the control loop.

Again, as in other embodiments, the DSP provides control of the modulator 60 over the bus 83.

Thus, by detecting the output peak-to-average output signal at the rf power amplifier, control is achieved to reduce output distortion.

What is claimed is:

1. A method of controlling a radio frequency amplifier comprising:
   sensing an input signal to the amplifier;
   determining an input ratio of peak-to-average values of the sensed input signal;
   sensing an output signal from a radio frequency amplifier;
   determining an output ratio representing output peak-to-average values of the sensed signal;
   comparing the output ratio with the input ratio; and
   adjusting the output signal from the amplifier based on the results of the comparison.

2. The method defined by claim 1, wherein each of the sensing steps comprises sampling an envelope of one of the input or output signal, and then computing from the samples the peak-to-average ratio.

3. The method defined by claim 1, wherein each of the sensing and determining steps comprise:
   detecting an envelope of the sensed signal;
   determining an average value for the envelope;

determining a maximum value for the envelope;

converting the average value and maximum value to a digital signal; and dividing the digital signal representing the peak by the digital signal representing the average to determine the peak-to-average ratio.

4. The method defined by claim 1, wherein the sensed input and output signals are converted to digital signals which are then coupled to a digital signal processor (DSP), the DSP providing a control signal to a modulator, and where the DSP adjusts a modulated signal to control the input signal to the amplifier.

5. The method defined by claim 1, wherein the sensed input and output signals are converted to digital signals which are coupled to a computational means for computing a control signal used to adjust the output signal from the amplifier.

6. A radio frequency amplifier including:

a first ratio determining means for determining a first ratio of the peak-to-average output signal from the amplifier;

a second ratio determining means for determining a second ratio of the peak-to-average input signal to the amplifier; and control means for controlling the output signal from the amplifier based on the first and second ratios.

7. The apparatus of claim 6, wherein the first ratio determining means includes:

a peak detector means coupled to receive the output signal from the amplifier;

an averaging means coupled to the peak detector means; and an analog-to-digital converter coupled to the averaging means.

8. The apparatus of claim 7, including an envelope detector coupled between the output of the amplifier and the peak detector means and averaging means.

9. The apparatus defined by claim 6, wherein each of the first and second ratio determining means includes:

a peak detector means coupled to receive one of the input or output signals of the amplifier;

an averaging means coupled to the peak detector means; and an analog-to-digital converter coupled to the averaging means.

* * * * *